United States Patent [19]

Carl et al.

[11] Patent Number: 5,610,441

[45] Date of Patent: Mar. 11, 1997

[54] ANGLE DEFINED TRENCH CONDUCTOR FOR A SEMICONDUCTOR DEVICE

[75] Inventors: Daniel A. Carl, Santa Clara County, Calif.; Donald M. Kenney; Walter E. Mlynko, both of Chittenden County, Vt.; Son V. Nguyen, Dutchess County, N.Y.

[73] Assignee: International Business Machines Corporation, Armonk, N.Y.

[21] Appl. No.: 444,465

[22] Filed: May 19, 1995

[51] Int. Cl.⁶ .............................. H01L 23/18; H01L 23/52
[52] U.S. Cl. ...................... 257/774; 257/244; 257/734; 257/754
[58] Field of Search ...................................... 257/244, 283, 257/304, 311, 330, 385, 754, 774, 734

[56] References Cited

U.S. PATENT DOCUMENTS 5,014,099   5/1991   McElroy ................................ 257/283

*Primary Examiner*—Stephen Meier
*Assistant Examiner*—Carl Whitehead, Jr.
*Attorney, Agent, or Firm*—Whitham, Curtis, Witham & McGinn; Alison D. Mortinger

[57] ABSTRACT

Polysilicon in a trench is etched at an angle to produce a conductor within the trench that has shape characteristics which approximate the shadow of the side wall of the trench closest the beam source. Specifically, when the first side wall is closest to the beam source and the second side wall is furthest from the beam source, the polysilicon on the first side wall is almost as high as the first side wall, while the polysilicon on the more exposed side wall is considerably lower than the first side wall and approximates the shadow of the first side wall on the second side wall relative to the beam. The polysilicon in the trench may be in the shape of a solid angled block approximating the shadow line from the top of side wall to the shadow line on side wall however, it is preferred that the polysilicon take the form of a conformal layer in trench prior to etching such that the polysilicon ultimately has an angled "U" shape which approximates the shadow line. Contact is made to the polysilicon using strap that electrically connects the side wall with the polysilicon. Strap is sized such that it does not extend to the opposite side wall of trench, thereby avoiding short circuits. Having the polysilicon approximate the shadow line of the etch permits narrowing the distance between adjacent straps and in an array without the risk of creating a short.

3 Claims, 4 Drawing Sheets

ANGLE DEFINED TRENCH CONDUCTOR FOR A SEMICONDUCTOR DEVICE

BACKGROUND OF THE INVENTION

1. Field of the Invention

The present invention generally relates to integration density enhancements of very large scale integrated (VLSI) circuit devices and, more particularly, to increasing integration density of devices, such as dynamic random access memories (DRAMs), by the use of an angled etch to selectively remove a polysilicon liner from one side of a trench in a manner that prevents one side of a trench from short-circuiting to the adjacent surface strap.

2. Background Description

Current layout rules and manufacturing overlay technology limit the minimum cell width. If layout rules could be enhanced the result would be increased storage cell density for DRAMs. A common trench type DRAM cell configuration requires certain minimum dimensions, in the direction parallel to word lines, for proper connection of the polysilicon trench fill storage node to the node diffusion outside the trench. Currently, there are four critical dimensions (i.e., layout rules) in the manufacture of merged isolation and node trench DRAMs:

- the silicon strap overlap outside a deep trench, for node diffusion contact,
- the silicon strap overlap inside a deep trench, for polysilicon node contact,
- the silicon strap to adjacent diffusion inside a deep trench for no contact to adjacent node diffusion, and
- the silicon strap to an adjacent trench for no contact to adjacent trench polysilicon node.

These four dimensions or rules result in a minimum cell width of 0.85 µm, using a contemporary set of layout rules. By application of the usual generation scaling factor of 0.7×, a strap limited cell width of 0.60 µm is obtained. This is not small enough to meet a 4×× higher density objective. A cell width of 0.50 µm to 0.55 µm is needed.

SUMMARY OF THE INVENTION

It is therefore an object of the present invention to provide a reduced minimum cell width in order to meet higher density objectives in the manufacture of integrated circuit structures such as DRAMs.

It is another object of the present invention to use an angled etch in a novel manner to selectively remove a polysilicon liner from one side of a trench to prevent short circuiting to a surface strap.

According to the invention, there is provided a method of preparing a narrow trench which comprises the steps of providing a wafer with prepared deep trench structures which may have a collar of isolation oxide, depositing polysilicon over the wafer and in the deep trench structures, coating vertical and horizontal surfaces of the deep trench structures, and then removing polysilicon from a sidewall of each deep trench structure and from a top of the wafer, using an angled reactive ion etch (RIE). The resulting structure is an asymmetric trench conductor that connects the strap to the storage node, wherein the conductor is formed so that the top surface of the conductor at a first location is significantly closer to the top of the trench than the top of the conductor at a second location spaced from the first location. This allows the straps on either side of the trench to be closer together without risk of shorting. In the inventive method, the distance between straps may be reduced by 10–90%.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
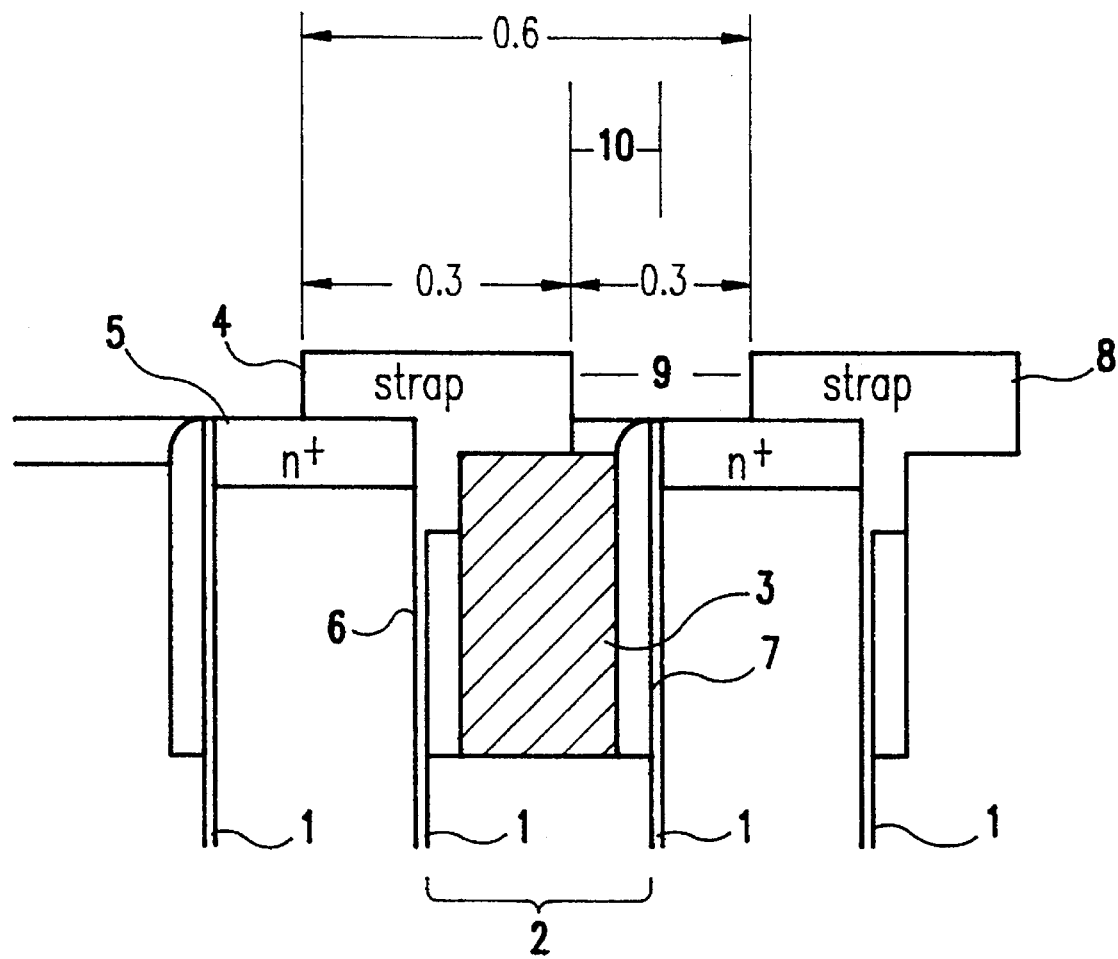
FIG. 1 is a cross sectional view of a substrate depicting the upper portion current capacitor structure in a merged isolation and node trench.

Referring now to the drawings, and more particularly to FIG. 1, there is shown a cross section of a current structure. There are four thin dielectrics 1 shown, the center two providing the boundaries of a trench 2. The trench 2 is filled with polysilicon 3. Strap 4 connects polysilicon 3 with N+ diffusion region 5. The area shown is only about a tenth of the depth of trench 2. The width of the trench 2 must be wide enough such that strap 4 makes connection on only a first sidewall 6 the trench 2 when all dimensional tolerances are considered; otherwise short circuiting will occur. If the strap 4 connects with both the first sidewall 6 and the second sidewall 7, a short circuit will occur with strap 8. In this example, the distance 9 between strap 4 and strap 8 is 0.3 microns. This leaves a space 10 of 0.15 microns between the strap 4 and the second sidewall 7 of the trench 2.

Figure 2A:
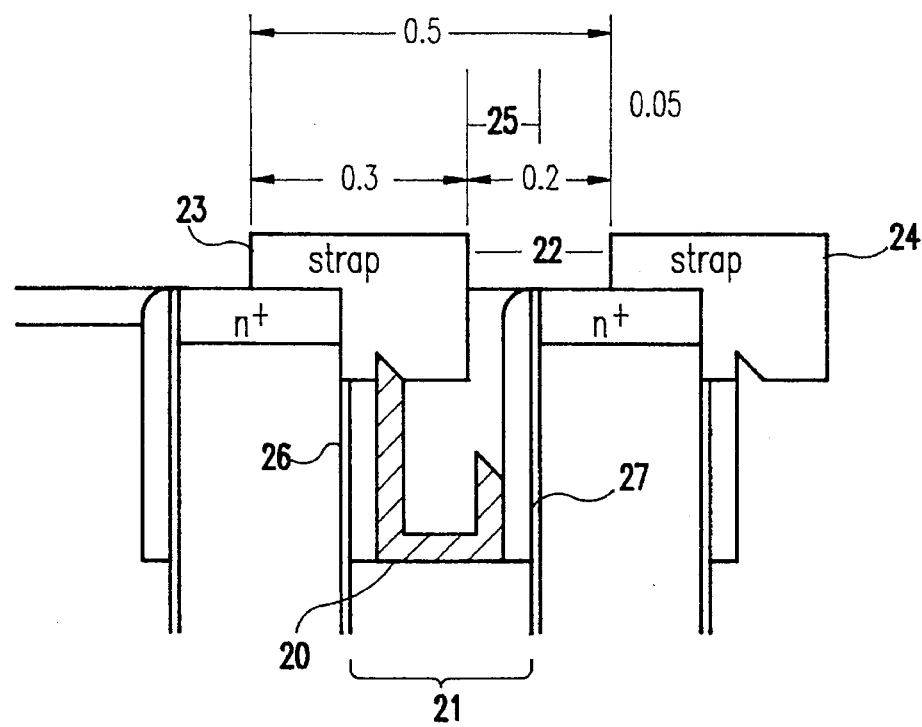
FIGS. 2A and 2B are cross sectional views of a substrate depicting the capacitor structure of the present invention.
Figure 2B:
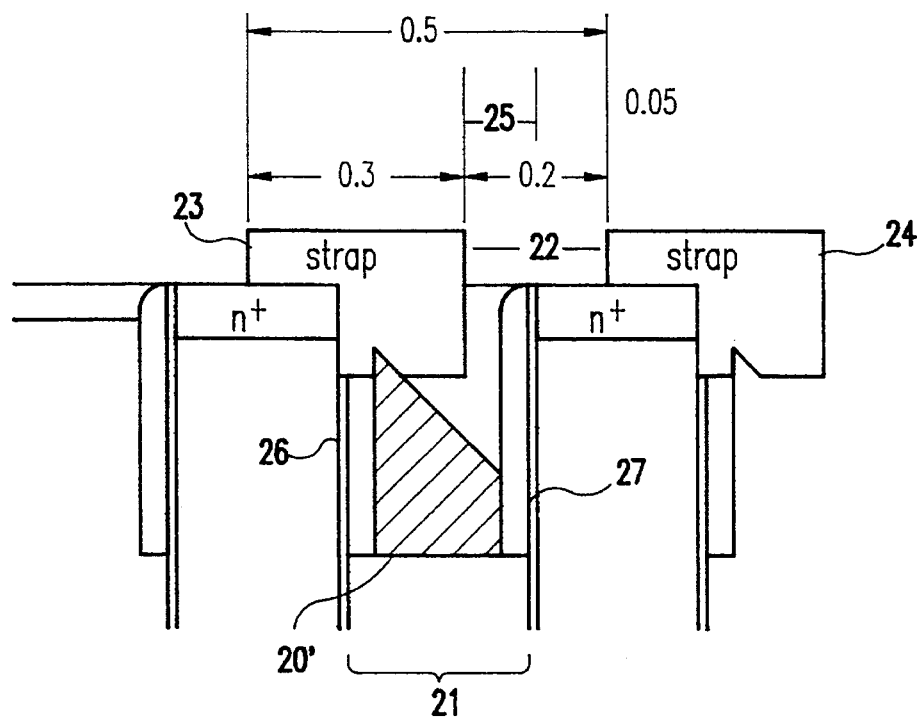

The present invention is illustrated in FIGS. 2A and 2B. As can be seen in FIG. 2A, polysilicon 20 is etched in an angled "U" shape in trench 21. Strap 23 makes a connection on only a first sidewall 26. This angling provides the opportunity to narrow the space taken up by the structure. In following the measurements of the example shown in FIG. 1, the distance 22 between the two straps 23 and 24 is now 0.2 microns, while still maintaining the space 25 of 0.15 microns between the strap 23 and second wall 27 of the trench 21. As shown in FIG. 2B, polysilicon 20' may be a solid angled block. However, a "U" shape as shown in FIG. 2A is preferable. The method of the present invention reduces the required distance between two straps by at least one third as shown by comparing FIG. 1 and 2A. It is expected that the method will allow reducing the spacing between the straps by 10–90%.

Figure 3A:
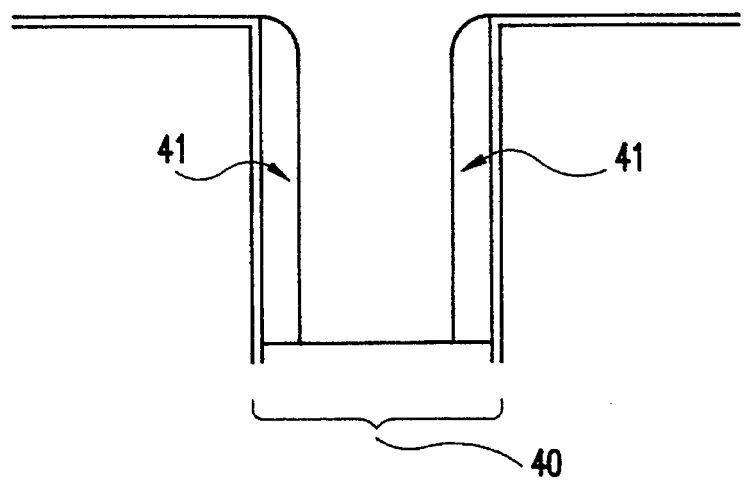
FIG. 3A, 3B and 3C are cross sectional views of a substrate showing the steps of the method of the present invention.
Figure 3B:
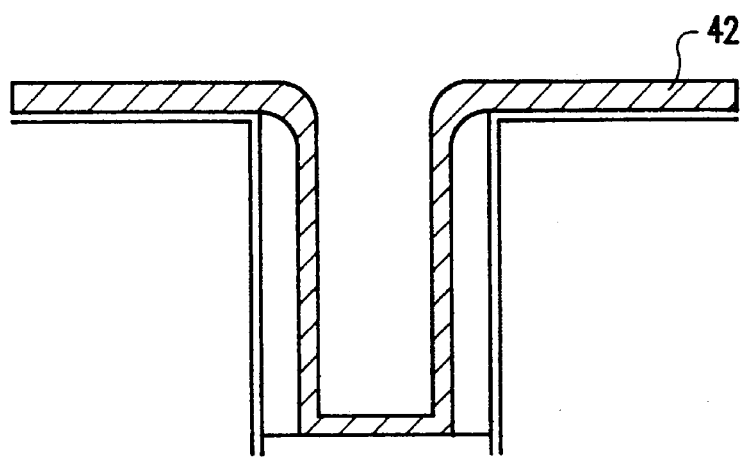
Figure 3C:
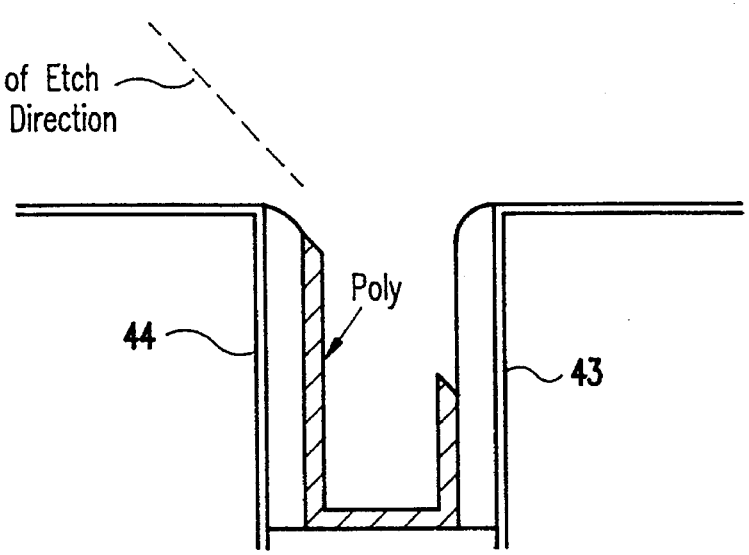

FIG. 3A shows a cross section of the upper portion of a deep trench 40 before preforming the steps of the present invention. A collar 41 may or may not be present in the trench 40 prior to polysilicon deposition. In FIG. 3B, a layer of polysilicon 42 is deposited in the trench 40 and over the substrate. This polysilicon could be deposited by filling the trench 40; however it is preferable to have a thin layer so that the angled "U" shape shown in FIG. 2A and 3C can be created. Finally, in FIG. 3C, the polysilicon is etched at an angle using a reactive ion etch (RIE). This can be done by tilting the wafer relative to the ion beam source. As a result, excess polysilicon is removed from the substrate surface outside the trench and from the second wall 43 of the trench 40, while leaving a layer of polysilicon fully covering a first wall 44 of the trench. Note that the trench will later be capped by a shallow trench isolation (STI) oxide, and this STI oxide will be much thicker over the second sidewall 43 recessed by the angled etch, compared to the side shadowed during the angled etch. FIG. 3C shows etching along the shadow line.

Figure 4:
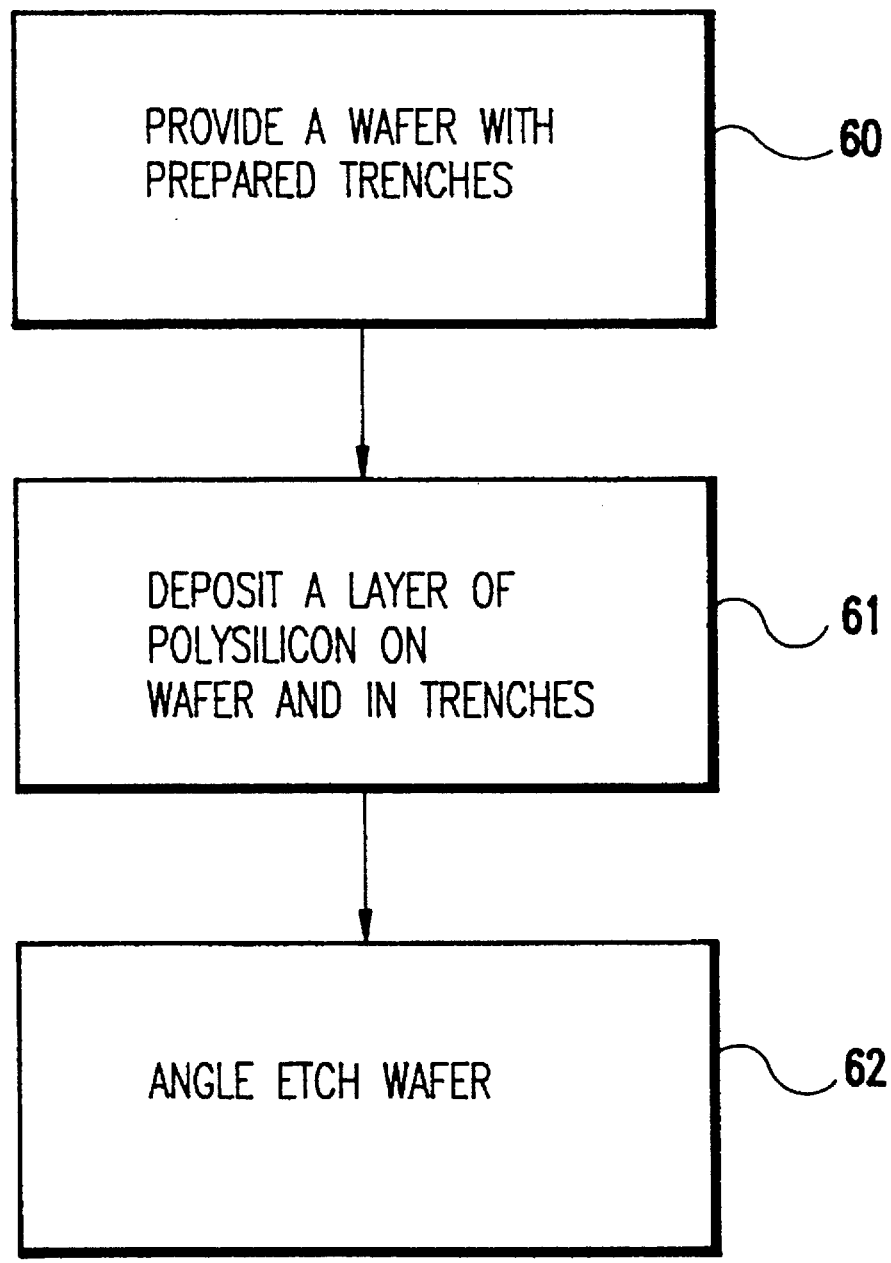
FIG. 4 is a flow chart of the method of the present invention.

The flow chart of FIG. 4 shows the steps of the present invention as they are illustrated in FIGS. 3A to 3C. First, in step 60, a wafer is provided with prepared trenches. Next, in step 61, polysilicon for making the connection between diffusion and storage nodes is deposited. As stated above this is preferably deposited in a thin layer coating the trench bottom and side walls; however, the trench may be filled with polysilicon in this step. Finally, in step 62, the wafer is angle etched such that no polysilicon remains above the surface of the trench and one sidewall of the trench.

In the present invention, one layout rule has been altered to provide reduced minimum cell width. A wafer is processed according to standard procedures through collar formation. The trench "second fill" is deposited only 50 nm thick. The angled etch then allows the cell width to be reduced by 0.05 to 0.10 µm, resulting in a cell width of 0.50 to 0.55 µm. Cells must all be strapped on the same side in one preferred array layout. In that layout, cell device width may be reduced in order to reduce the cell width.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A substrate with densely packed conductors, comprising:

a substrate;

a trench in said substrate including first and second spaced apart sidewalls, said trench having a closed bottom which extends between said first and second spaced apart sidewalls and an open top;

polysilicon positioned within said trench and contacting said first and second sidewalls, said polysilicon having a top edge which is angled to approximate a shadow line that extends from said top of said trench on said first sidewall to an intermediate point on said second sidewall; and a conductor positioned on said substrate adjacent said trench, said conductor being in contact with said top edge of said polysilicon adjacent said first side wall of said trench.

2. The substrate of claim 1 wherein said polysilicon fills said trench between said first and second sidewalls.

3. The substrate of claim 1 wherein said polysilicon coats an internal surface defined by said first sidewall, said closed bottom, and said second sidewall, and assumes an angled U shape.

* * * * *